United States Patent
Sohn et al.

(10) Patent No.: US 7,782,683 B2
(45) Date of Patent: Aug. 24, 2010

(54) MULTI-PORT MEMORY DEVICE FOR BUFFERING BETWEEN HOSTS AND NON-VOLATILE MEMORY DEVICES

(75) Inventors: Han-gu Sohn, Gyeonggi-do (KR); Sei-jin Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 232 days.

(21) Appl. No.: 12/164,527

(22) Filed: Jun. 30, 2008

(65) Prior Publication Data

US 2008/0266988 A1    Oct. 30, 2008

Related U.S. Application Data

(62) Division of application No. 11/406,407, filed on Jan. 27, 2005, now Pat. No. 7,411,859.

(30) Foreign Application Priority Data

Jan. 30, 2004    (KR) .................................. 2004-6340

(51) Int. Cl.
*G11C 7/00*    (2006.01)
(52) U.S. Cl. .................. 365/189.2; 365/185.17; 365/189.05; 365/230.05
(58) Field of Classification Search .............. 365/185, 365/17, 189.05, 189.2, 230.05
See application file for complete search history.

(56) References Cited

U.S. PATENT DOCUMENTS 5,600,801 A    2/1997    Parks et al. .................. 710/301

(Continued)

FOREIGN PATENT DOCUMENTS

JP    8212774    8/1996

(Continued)

OTHER PUBLICATIONS

Chinese Office Action (6 pages) corresponding to Chinese Patent Application No. 2005100741851; Mailing Date: Jul. 11, 2008.

*Primary Examiner*—Dang T Nguyen
*Assistant Examiner*—Alexander Sofocleous
(74) *Attorney, Agent, or Firm*—Myers Bigel Sibley & Sajovec, P.A.

(57) ABSTRACT

A multi-port volatile memory device can include a first port that is configured for data transfer to/from an external host system and the device. A volatile main memory core is configured to store data received thereat and read requested stored data thereform. A volatile sub memory core can be configured to store data received thereat and read requested stored data therefrom. A main interface circuit can be coupled to the first port and can be configured to provide data to/from the volatile main memory core and the first port in a master mode and can be configured to provide data to/from the volatile sub memory core and the first port in a slave mode. A second port can be configured for data transfer to/from an external non-volatile memory device and the device and a sub interface circuit can be coupled to the second port and configured to provide data to/from the volatile sub memory core and the second port in the slave mode.

7 Claims, 6 Drawing Sheets

U.S. PATENT DOCUMENTS

| | | | |
|---|---|---|---|
| 5,604,710 A | 2/1997 | Tomishima et al. | 365/230.03 |
| 6,016,549 A | 1/2000 | Matsushiba et al. | 713/324 |
| 6,201,733 B1 | 3/2001 | Hiraki et al. | 365/185.08 |
| 6,301,143 B1 | 10/2001 | Fujita et al. | 365/63 |
| 6,434,658 B1 * | 8/2002 | Fukuzumi | 711/103 |
| 6,522,581 B2 | 2/2003 | Takata et al. | 365/185.05 |
| 6,691,205 B2 | 2/2004 | Zilberman | 711/103 |
| 6,744,692 B2 | 6/2004 | Shiota et al. | 365/230.03 |
| 6,788,613 B1 | 9/2004 | Gratrex et al. | 365/230.05 |
| 6,791,877 B2 | 9/2004 | Miura et al. | 365/185.11 |
| 7,467,251 B2 * | 12/2008 | Park et al. | 710/307 |
| 7,613,880 B2 * | 11/2009 | Miura et al. | 711/115 |
| 2002/0185337 A1 | 12/2002 | Miura et al. | 185/11 |
| 2003/0188087 A1 | 10/2003 | Tsai et al. | 711/104 |
| 2004/0024955 A1 | 2/2004 | Patel | 711/100 |
| 2005/0091547 A1 | 4/2005 | Hanrieder et al. | 713/310 |

FOREIGN PATENT DOCUMENTS

| | | |
|---|---|---|
| KR | 990042163 | 6/1999 |
| KR | 10-2001-0070038 | 7/2001 |
| KR | 2002-0095109 | 12/2002 |

* cited by examiner

MULTI-PORT MEMORY DEVICE FOR BUFFERING BETWEEN HOSTS AND NON-VOLATILE MEMORY DEVICES

CROSS-REFERENCE TO RELATED APPLICATION

This application is a divisional of U.S. patent application Ser. No. 11/406,407, filed Jan. 27, 2005, now U.S. Pat. No. 7,411,859, which claims priority from Korean Patent Application No. 2004-6340, filed on Jan. 30, 2004, the disclosures of both of which are incorporated herein by reference in their entirety.

FIELD OF THE INVENTION

The present invention relates to memory devices and more particularly to non-volatile memory devices.

BACKGROUND

Large capacity memories are sometimes needed to store image data generated by mobile systems equipped with a digital camera module or capable of accessing an Internet. Generally, mobile phones use a NOR type flash memory as a high-speed random access memory to store instruction codes for processing the data. However, NOR type flash memory may be relatively expensive to use in applications requiring more capacity (such as to store image data). Accordingly, NOR type flash memories may not be widely used for such applications.

NAND type flash memory devices operate at a lower speed compared to the NOR type flash memory, however, NAND type flash memories may be more cost effective than NOR type flash memories in applications which call for more storage capacity, such as storing image data generated by a digital camera in a mobile phone. However, the slower speed of the NAND type flash memory devices may make using these devices problematic.

In some mobile applications, a central processing unit (CPU) controls the storage of image data in a DRAM and performs digital image processing, such as compressing the stored image data, so that the processed data may be stored in a NAND type flash memory. The CPU accesses the DRAM and the NAND type flash memory via respective interfaces. The DRAM may communicate with the NAND type flash memory using Direct Memory Access (DMA). Accordingly, using a DRAM as a buffer may enable the use of the slower type flash memory (i.e., NAND type flash memory).

Performance of such a mobile system may be reduced since the NAND type flash memory operates at a lower speed than the DRAM. Additionally, since the CPU accesses the DRAM and the NAND type flash memory using respective hardware interfaces (i.e., pins) the size of the CPU package may be relatively large when the system is integrated into a single chip, which may affect the overall size/weight of a mobile phone (due to the use of the NAND type flash memory).

It is known to provide a system interface in which the system (such as a CPU) communicates with a NAND type flash memory using a static random access memory (SRAM) as a buffer (introduced by Toshiba Corporation of Japan). In this approach, the NAND type flash memory may be effectively controlled at the speed of the interface between the system and the SRAM.

Korean patent laid open publication number 2002-95109, by Hitatchi, discusses a semiconductor device including a non-volatile memory (such as a flash memory), a DRAM with a control circuit connected to both the flash memory and the DRAM, and having a structure for integrating those memories into a multi-chip module. In this approach the control circuit of the semiconductor memory device loads data into the DRAM and then transfers the loaded data from the DRAM to the flash memory responsive to an external command. During a read operation, data stored in the flash memory is transferred to the DRAM, and then the transferred data is read from the DRAM.

SUMMARY

Embodiments according to the invention can provide multi-port memory device for buffering between hosts and non-volatile memory devices. Pursuant to some of these embodiments, a multi-port volatile memory device includes a first port configured for data transfer to/from an external host system and the device. A volatile main memory core is configured to store data received thereat and read requested stored data thereform. A volatile sub memory core is configured to store data received thereat and read requested stored data therefrom. A main interface circuit is coupled to the first port and configured to provide data to/from the volatile main memory core and the first port in a master mode and configured to provide data to/from the volatile sub memory core and the first port in a slave mode. A second port is configured for data transfer to/from an external non-volatile memory device and the device. A sub interface circuit is coupled to the second port and configured to provide data to/from the volatile sub memory core and the second port in the slave mode.

DESCRIPTION OF EMBODIMENTS ACCORDING TO THE INVENTION

Figure 1:
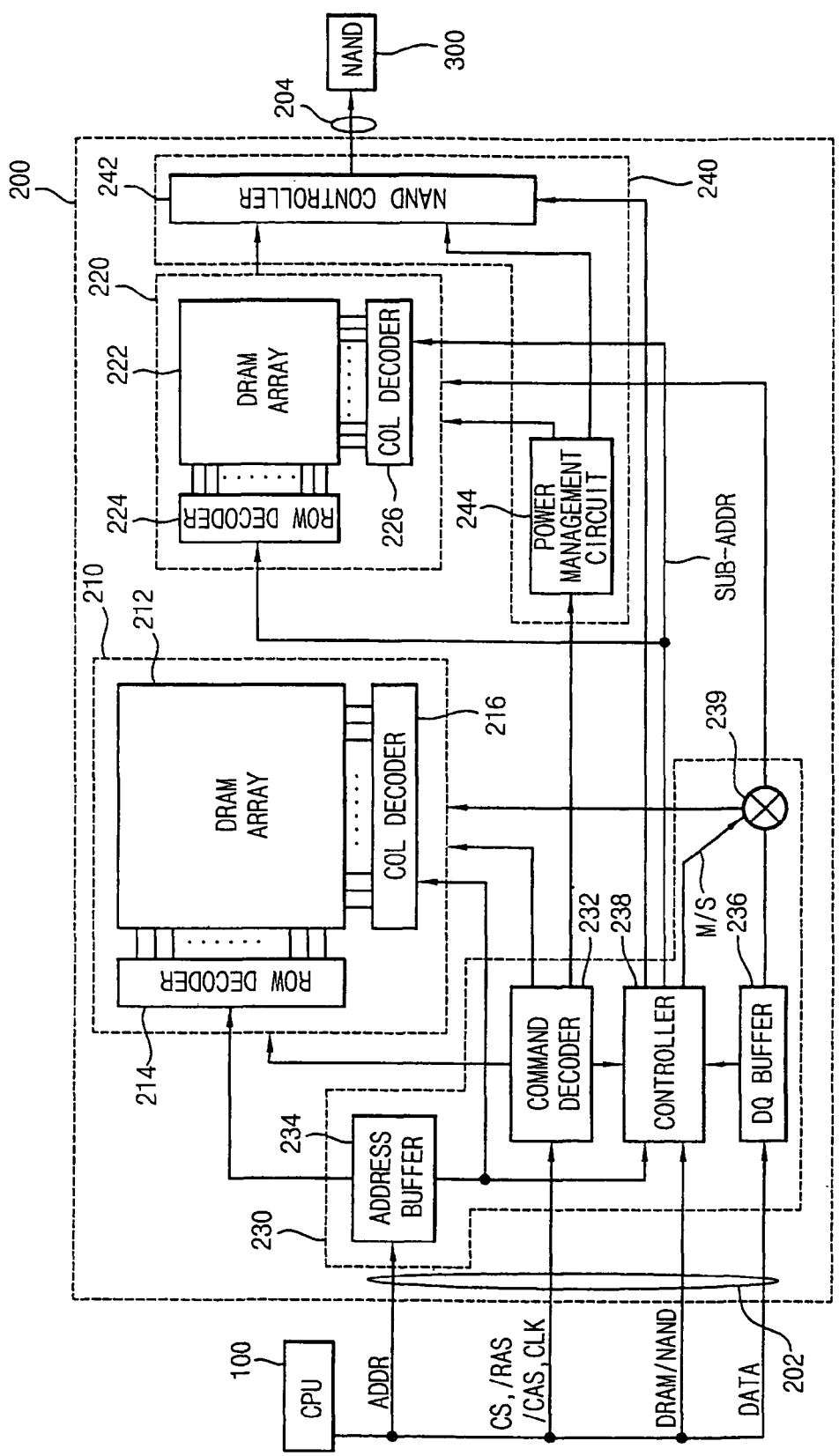
FIG. 1 is a block diagram illustrating a configuration of a volatile memory acting as a master according to some exemplary embodiments of the present invention.

The invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein the term "and/or" includes any and all combinations of one or more of the associated listed items.

It will be understood that, when an element is referred to as being "coupled" to another element, it can be directly coupled to the other element or intervening elements may be present. In contrast, when an element is referred to as being "directly coupled" to another element, there are no intervening elements present. Like numbers refer to like elements throughout. It should be emphasized that the term "comprises/comprising" when used in this specification is taken to specify the presence of stated features, integers, steps or components but does not preclude the presence or addition of one or more other features, integers, steps, components or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. The terms first and second may be used herein to describe various components these components should not be limited by these terms. These terms are only used to distinguish one component from another. Thus, for example, a first component discussed below could be termed a second component without departing from the teachings of the present invention.

As will be appreciated by one of skill in the art, the present invention may be embodied as methods, systems, and/or computer program products. Accordingly, the present invention may take the form of an entirely hardware embodiment, an entirely software embodiment or an embodiment combining software and hardware aspects. Furthermore, the present invention may take the form of a computer program product on a computer-usable storage medium having computer-usable program code embodied in the medium. Any suitable computer readable medium may be utilized including hard disks, CD-ROMs, optical storage devices, or magnetic storage devices.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Computer program code or "code" for carrying out operations according to the present invention may be written in an object oriented programming language such as JAVA®, Smalltalk or C++, JavaScript, Visual Basic, TSQL, Perl, or in various other programming languages. Software embodiments of the present invention do not depend on implementation with a particular programming language. Portions of the code may execute entirely on one or more systems utilized by an intermediary server.

The code may execute entirely on one or more servers, or it may execute partly on a server and partly on a client within a client device or as a proxy server at an intermediate point in a communications network. In the latter scenario, the client device may be connected to a server over a LAN or a WAN (e.g., an intranet), or the connection may be made through the Internet (e.g., via an Internet Service Provider). It is understood that the present invention is not TCP/IP-specific or Internet-specific. The present invention may be embodied using various protocols over various types of computer networks.

The present invention is described below with reference to block diagram illustrations of methods, systems and computer program products according to embodiments of the invention. It is understood that each block of the illustrations, and combinations of blocks in the illustrations can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the block(s).

These computer program instructions may be stored in a computer-readable memory that can direct a computer or other programmable data processing apparatus to function in a particular manner, such that the instructions stored in the computer-readable memory produce an article of manufacture including instruction means which implement the function specified in the block(s).

The computer program instructions may be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the block diagrams and/or flowchart block or blocks.

FIG. 1 is a block diagram illustrating a configuration of a volatile memory configured to operate in master and/or slave modes according to some exemplary embodiments of the present invention. Referring to FIG. 1, a central processing unit (CPU) 100 of a mobile application system is connected to a NAND flash memory 300 via a DRAM 200 (or volatile memory) configured as a master relative to a NAND type non-volatile flash memory configured as a slave relative to the master. It will be understood that FIG. 1 shows a "CPU" block 100 that can represent an entire mobile application system as a matter of convenience.

The system 100 provides the DRAM 200 with an address signal ADDR, various commands such as a chip selection signal CS, a row address strobe signal RAS, a column address strobe signal CAS and a clock signal CLK, a DRAM/NAND flash mode signal DRAM/NAND and data transferred between the system 100 and the DRAM 200.

In some embodiments according to the invention, the DRAM 200 includes two ports: a first port 202 that is configured to couple to the system 100 and a second port 204 that is configured to be coupled to the NAND flash memory 300 through which the DRAM 200 can communicate with the NAND flash memory 300 (using a volatile buffer described herein).

In particular, the DRAM 200 may include a main memory core 210 and a sub memory core 220. The main memory core 210 includes a cell array 212, a row decoder 214 and a column decoder 216 and is configured to provide storage available via the first port in a master mode and in a slave mode. The sub memory core 220 includes a cell array 222, a row decoder 224 and a column decoder 226 to provide storage in the slave mode.

Further, the DRAM 200 may include a main interface circuit 230 and a sub interface circuit 240. The main interface circuit 230 includes a command decoder 232, an address buffer 234, an input and output buffer (DQ buffer) 236, a controller 238 and a master and slave mode selector 239.

The command decoder 232 receives commands CS, /RAS, /CAS and CLK from the external system 100. The DRAM 200 are controlled based on the commands, i.e. control signals such as the chip select signal CS, the row address strobe signal /RAS, the column address strobe signal /CAS, the clock signal CLK, a write enable signal /WE, a chip enable signal /CE, etc. The command decoder 232 decodes the control signals and determines an operation mode such as a write operation or a read operation, etc. The command decoder 232 generates internal command control signals based on the determined operation mode to provide the generated internal command control signals to the main memory core 210, the controller 238 and the sub interface circuit 240.

The address buffer 234 receives an address signal ADDR provided from the system 100 to generate internal address signals that are synchronized with the clock CLK. The internal address signals are applied to the main memory core 210 and the controller 238. The internal address signals provided to the main memory core 210 include a row address and a column address. The internal address signal input to the controller 238 corresponds to control data provided from the system 100 such as mode set data, an initial address information of the NAND flash memory, an address information of the sub memory core 220, etc.

The input and output buffer (DQ buffer) 236 buffers input/output data transferred between the main memory core 210 and the system 100 or between the sub memory core 220 and the system 100. The input and output buffer 236 provide the controller 238 with information of data size of the NAND flash memory 300.

The controller 238 provides the sub interface circuit 240 with the initial address information of the NAND flash memory and the address information to the sub memory core 220 that is included in the control data provided through the address buffer 234. The controller 238 generates a master and slave mode select signal M/S based on the mode set data.

The controller 238 controls read operation or write operation of the sub memory core 220 in the slave mode. The master and slave mode selector 239 selectively connects the input and output buffer 236 with the main memory core 210 or with the sub memory core 220 based on the M/S signal. In some embodiments according to the invention, the mode selector 239 may be implemented in the controller 238.

The sub interface circuit 240 includes a NAND flash controller 242 and a power management circuit 244. The NAND flash controller 242 interfaces the sub memory core 220 with the NAND flash memory 300 via the second port 204 in the slave mode. The NAND flash controller 242 receives the address information of the NAND flash from the controller 238 and provides the address information to the flash memory 300 via the second port 204 to control read and writes operation of the flash memory 300 in the slave mode.

The power management circuit 244 manages a power supply of the sub memory core 220 and a power supply of the NAND flash controller 242 in response to a power control signal of the command decoder 232. The power management circuit 244 supplies a power voltage to the sub memory core 220 and the NAND flash controller 242 in an operation mode. In an idle mode, voltage is not supplied to the sub memory core 220 and the NAND flash controller 242 so that power consumption may be reduced.

Figure 2:
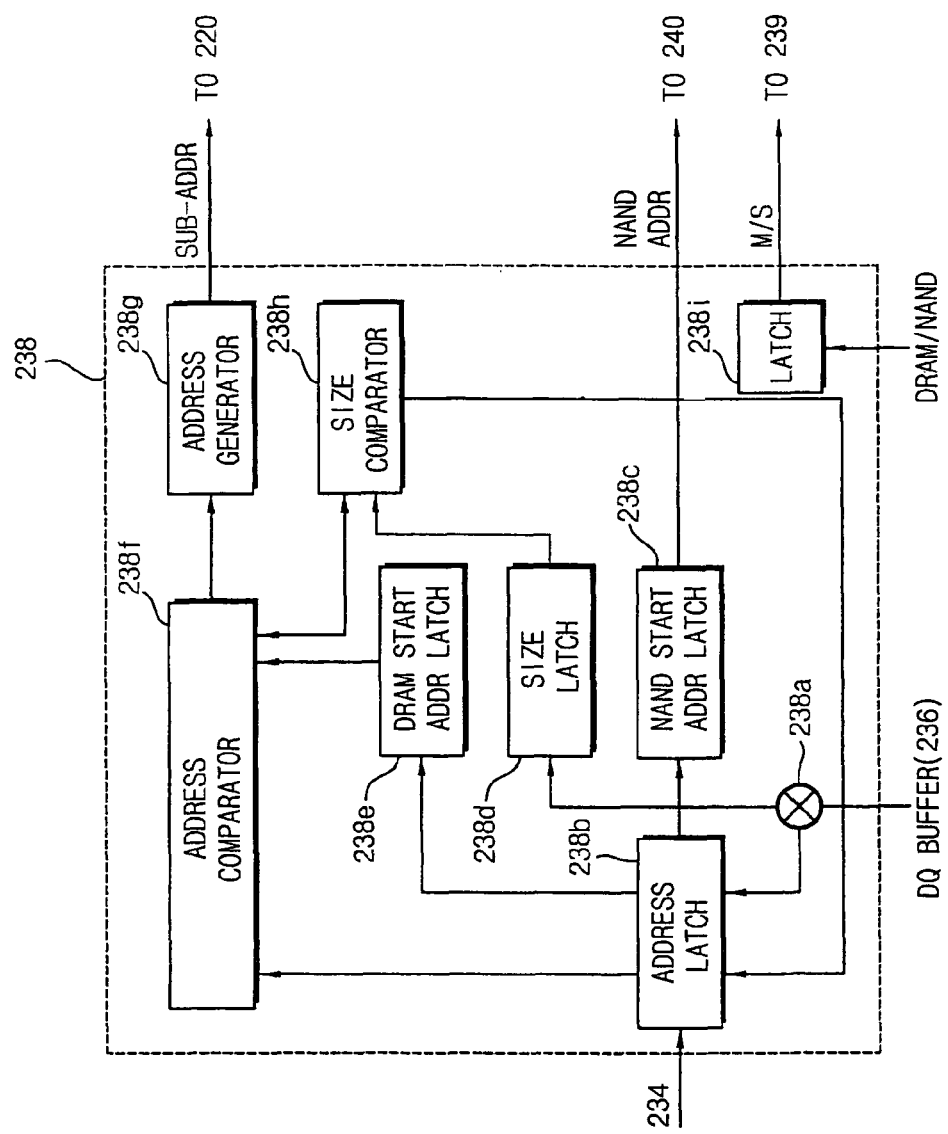
FIG. 2 is a block diagram illustrating a controller in FIG. 1 according to some exemplary embodiments of the present invention.

Referring to FIG. 2, the controller 238 includes a switch 238a, an address latch 238b, a NAND start address latch 238c, a size latch 238d, a DRAM start address latch 238e, an address comparator 238f, an address generator 238g, a size comparator 238h and a latch 238i. FIG. 2 shows only blocks for processing an address, wherein blocks for processing the internal command control signals of the command decoder 232 and for generating the master and slave mode select signal M/S are not discussed herein. The switch 238a provides the information of the data size of the NAND flash memory to the address latch 238b or the size latch 238d.

The address latch 238b latches the internal address information signal provided from the address buffer 234, data, which include the information of the data size, provided from the switch 238a and data provided from the size comparator 238h. The latched data of the address latch 238b are applied to the address comparator 238f and to the NAND flash mode start address latch 238c. The NAND flash mode start address latch 238c latches the data outputted from the address latch 238b to generate the NAND flash mode start address NAND-ADDR.

The size latch 238d latches the information of the data size of the NAND flash memory outputted from the switch 238a and provides the latched information of the data size to the size comparator 238h. The size comparator 238h compares the data from the address comparator 238f with the data including the information of the data size from the size latch 238d. A result of the comparison is provided to the address latch 238b.

The address generator 238g generates a sub address SUB-ADDR (e.g., row and column addresses of the sub memory core 220), based on a result of the comparison provided from the address comparator 238f. The latch 238i outputs the master/slave mode select signal M/S to the mode selector 239 based on the DRAM/NAND flash mode signal DRAM/NAND.

In operation, a main program for the dual port memory performs operations corresponding to an idle mode, a DRAM mode, a NAND flash mode, and a power management mode, etc. In brief, in the idle mode, the DRAM refresh operation is maintained in a power saving mode. In the DRAM mode, read and write operations are performed to/from the main memory core 216. In the NAND flash mode, read and write operations are performed to/from the NAND flash memory 300. In addition, in the power management mode, the main program cuts off a power supply of the sub memory core 220 in the idle mode and refreshes a memory to preserve stored data therein when the power supply is cut off, etc.

Figure 3:
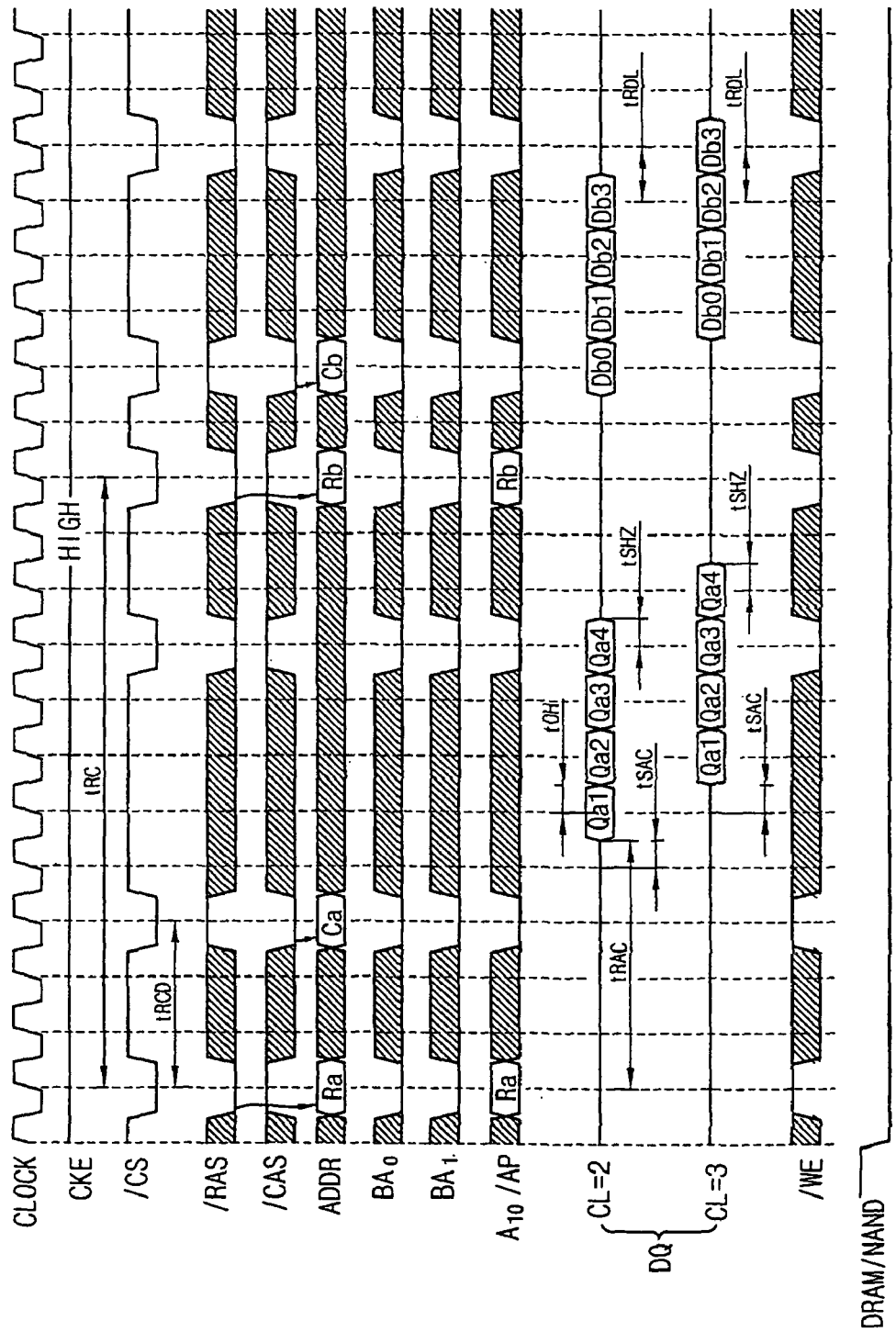
FIGS. 3 and 4 are timing diagrams illustrating operations of volatile memories acting as a master in FIG. 1 according to some exemplary embodiments of the present invention.

Referring to FIG. 3, in DRAM mode a DRAM/NAND flash mode signal DRAM/NAND has a logical low level in the DRAM mode and a data path is provided to/from the main memory core 216, which performs normal synchronous DRAM operations. In operation, a row address Ra is provided on the address line ADDR in response to a falling edge of /RAS, and a column address Ca is provided on the address line ADDR in response to a falling edge of /CAS.

When the write enable signal /WE has a high state, a read operation is performed and data Qa1, Qa2, Qa3 and Qa4 corresponding to the row address Ra and the column address Ca of the main memory core 210 are read out. Then, when the write enable signal /WE has a low state, a write operation is performed and data Db0, Db1, Db2 and Db3 corresponding to the row address Rb and the column address Cb of the main memory core 210 are written into "b" address of the main memory core 210. The shaded periods in FIG. 4 represent 'don't care'.

In the NAND flash mode, the DRAM/NAND flash mode signal DRAM/NAND has a logical high level, and a data path is connected to the sub memory core 220. Therefore, data to be written into the NAND flash memory 300 is written to the sub memory core 220 upon the control of the controller 238. When a size of the data that were written into the sub memory core 220 has a size of 'block', the NAND flash controller 242 is activated, and the data written into the sub memory core 220 is written to the NAND flash memory 300 through the second port 204 by the controller 238.

Figure 4:
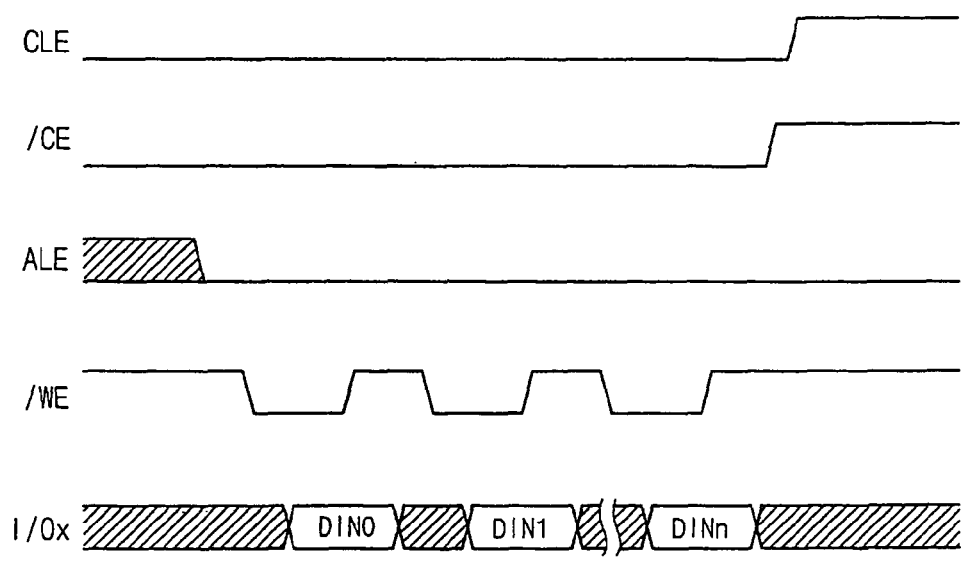

Referring to FIG. 4, in NAND flash mode, a write to the NAND flash memory 300 is performed in response to a chip enable signal /CE having a low state and the write enable signal /WE having a low state. Data is output to an input and output line I/Ox of the second port 204 and the output data is written into the NAND flash memory 300. A signal CLE represents a command latch enable signal and a signal ALE represents an address latch enable signal, and commands and addresses are multiplexed into the input and output line I/Ox based on the CLE and ALE signals, respectively. Therefore, the sub memory core 220 may be determined based on the 'block' size. In some embodiments according to the invention, the sub memory core 200 has a size equal to or less than 1 MB (megabyte).

Additionally in NAND flash mode, an address provided from the system 100 is used as an address of the NAND flash 300. The address of the NAND flash 300 is latched into the controller 238 using the address buffer 234 when the row address strobe signal /RAS has a logical low level and the DRAM/NAND flash mode signal has a high logical level.

Data is read out by the NAND flash controller 242 from the NAND flash memory 300 in response to the chip enable signal /CE having an active state and the write enable signal /WE having a non-active state, and are written into the sub memory core 220 via the input and output line I/Ox of the second port 204. Then, the data written in the sub memory core 220 is read from the sub memory core 220 and is transferred to the system 100 through the input/output buffer 236. Therefore, in NAND flash mode data may be written to/read from the NAND flash memory 300 at the speed in which the system 100 accesses the DRAM.

Figure 5:
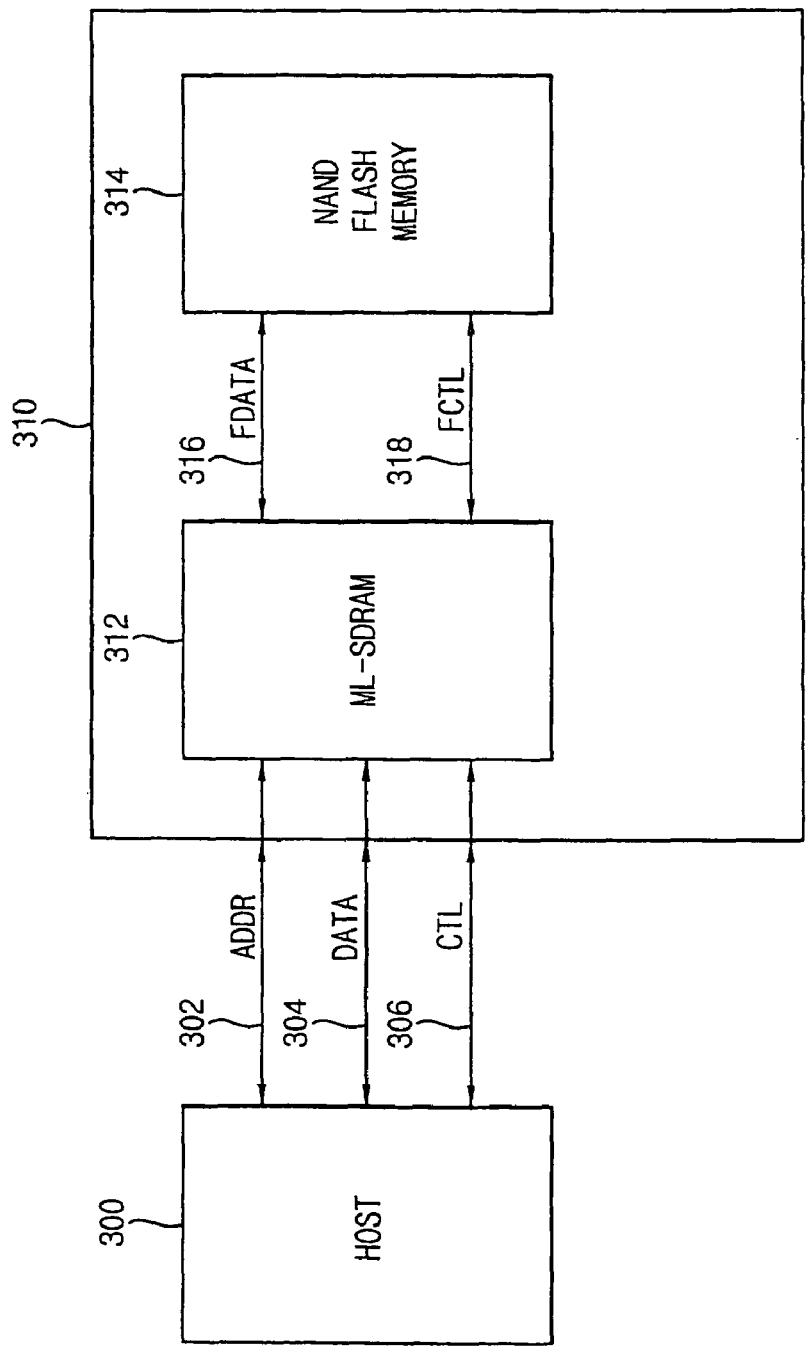
FIG. 5 is a block diagram illustrating a configuration of a data processing apparatus according to some exemplary embodiments of the present invention.

FIG. 5 is a block diagram illustrating a configuration of a data processing apparatus according to some exemplary embodiments of the present invention. Referring to FIG. 5, the data processing apparatus includes a host 300 and a multi-chip packaged semiconductor device 310. The host 300 includes a microprocessor and a memory controller. The host 300 is connected to the multi-chip packaged semiconductor device 310 via an address bus 302, a data bus 304 and a control bus 306. The multi-chip packaged (MCP) semiconductor device 310 is a multi-chip package (MCP) where a memory link SDRAM (ML-SDRAM) 312 and a NAND flash memory 314 are implemented into a single package. The ML-SDRAM 312 is connected to the NAND flash memory 314 via a data bus 316 and a control bus 318.

The address bus 302 and the data bus 304 of the present invention may be the same as those of a general synchronous DRAM. The control bus 306 includes control signal lines CTL such as CLK, CKE, DCS, RAS, CAS, WE, DQM, etc., that are generally used for DRAM control signal lines. The control bus 306 may further include signal lines such as FCS, WAIT, etc. The FCS signal is used to select a NAND flash memory chip and the WAIT signal is used to notify the host 300 that read, program, or erase operation of the NAND flash memory chip is complete. The control bus 318 includes flash memory control signal lines FCTL such as CLE, ALE, CE, RE, WE, RB.

Figure 6:
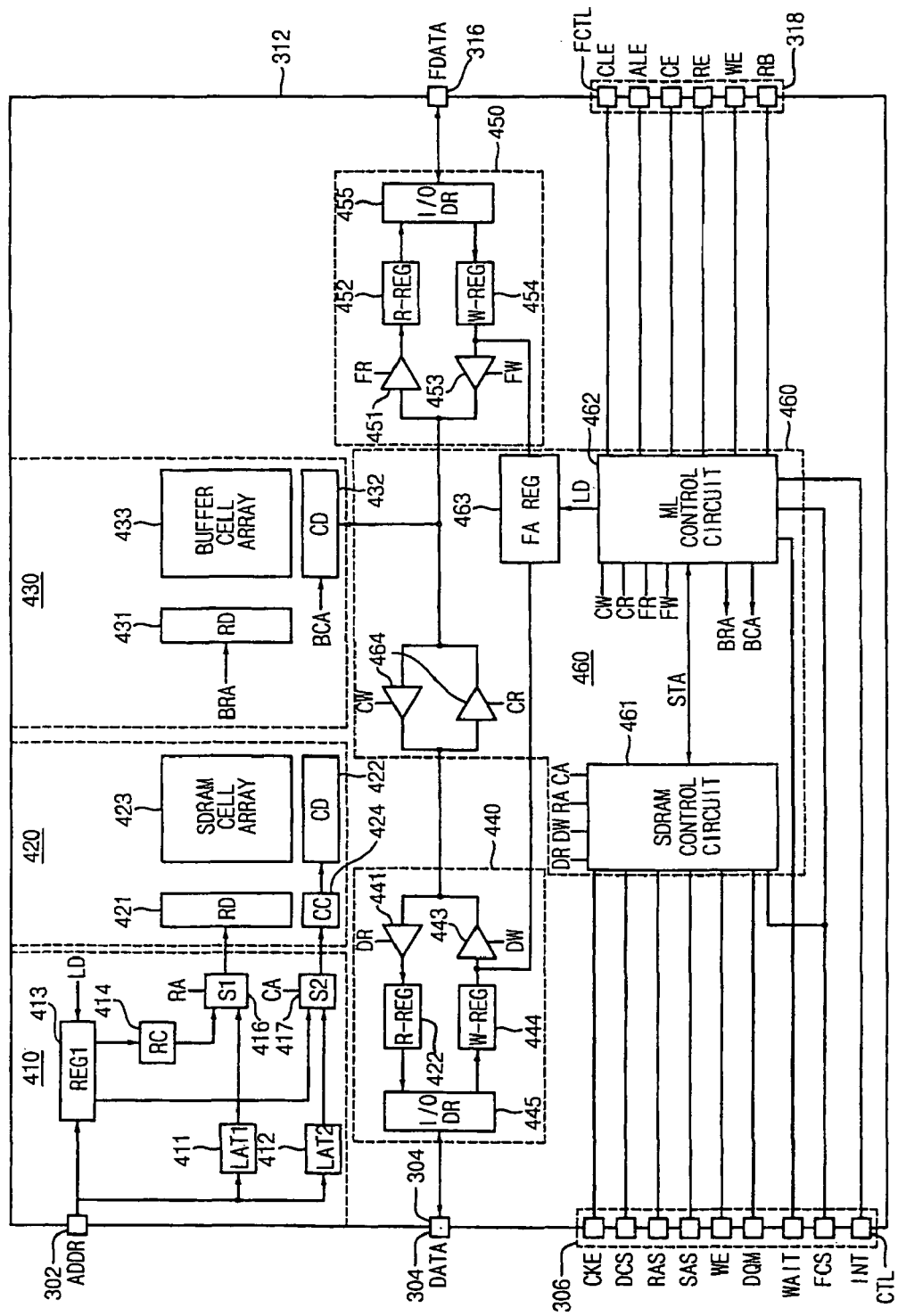
FIG. 6 is a block diagram illustrating a configuration of a memory link nonvolatile memory of a multi-chip packaged semiconductor device in FIG. 5.

FIG. 6 is a block diagram illustrating a configuration of a memory link nonvolatile memory (e.g., ML-SDRAM) 312 of the multi-chip packaged semiconductor device 310 in FIG. 5. Referring to FIG. 6, the ML-SDRAM 312 includes an address generating circuit 410, a main memory core 420, a sub memory core (or a buffer memory core) 430, a first data input and output unit 440, a second data input and output unit 450 and a controller 460.

The address generating circuit 410 includes a first latch 411 for latching a row address signal, a second latch 412 for latching a column address signal, a first address register 413 for storing an address signal, a row counter 414, a first selector 416 and a second selector 417.

In the DRAM mode, the address generating circuit 410 latches the row address and the column address using the first and second latches 411 and 412 to provide the latched row address and the column address to the first and second selectors 416 and 417. The first and second selectors 416 and 417 select the first and second latches 411 and 412 in the DRAM mode in response to RA and CA control signals, and the row address and the column address are used as an address signal of the main memory core 420. The address generating circuit 410 stores the row address and column address in the first address register 413 in a copy mode. In a copy mode of operation, data stored in the main memory core 420 is copied into the buffer memory core 430 or data stored in the buffer memory core 430 is copied into the main memory core 420.

The row address stored in the first address register 413 is provided to the first selector 416 via the row counter 414, and the column address is provided to the second selector 415. The first and second selectors 416 and 417 select the first address register 413 and the row counter 414 in the copy mode in response to the RA and CA control signals so as to use the row address and the column address as an address signal of the main memory core 420.

The main memory core 420 has a large capacity for storing data during executing programs. The main memory core 420 includes a row decoder 421, a column decoder 422, a cell array 423 and a column counter 424. The row counter 414 has a row address signal inputted in the copy mode as an initial value and generates consecutive row addresses based on the initial value. The column counter 424 receives a column address signal in a burst operation mode of DRAM and in the copy mode as an initial value and generates consecutive column addresses based on the initial value.

The buffer memory core 430 is used as a buffer area for storing data in a unit of "page" or "block". The flash memory is usually erased in units of memory called "block", and is usually reprogrammed and written in units of memory called "page". The 'block' includes a plurality of 'pages'. The buffer memory core 430 includes a row decoder 431, a column decoder 432 and a cell array 433. The buffer memory core 430 selects a cell based on a buffer row address signal BRA and a buffer column address signal BCA that are provided from the controller 460.

The first data input and output unit 440 acts as a data input and output interface with the SDRAM and includes a read buffer 441, a read register 442, a write buffer 443, a write register 444 and an input and output driver 445. The read buffer 441 is controlled by a DRAM read control signal DR and the write buffer 443 is controlled by a DRAM write control signal DW. The first data input and output unit 440 allows data transfer between the host 300 and the main memory core 420 at a speed of accessing the SDRAM.

The second data input and output unit 450 acts as a data input and output interface with the NAND flash memory 314 and includes a read buffer 451, a read register 452, a write buffer 453, a write register 454 and an input and output driver 455. The read buffer 451 is controlled by a flash read control signal FR and the write buffer 453 is controlled by a flash write control signal FW. The second data input and output unit 450 allows data transfer between the NAND flash memory 314 and the buffer memory core 430 at a speed of accessing the NAND flash memory 314.

The controller 460 includes a SDRAM control logic circuit 461, an ML control logic circuit 462, a flash address register 463 and a switch 464. The SDRAM control logic circuit 461 receives SDRAM control signals such as CKE, DCS, RAS, CAS, WE and DQM and decodes various commands to generate internal control signals DR, DW, RA AND CA. The DR signal represents a DRAM read control signal, the DW signal represents a DRAM write control signal, the RA signal represents a row address select signal and the CA signal represents a column address select signal.

The ML control logic circuit 462 receives the FCS signal from the host 300 and generates various flash memory control signals such as CLE, ALE, CE, RE and WE. The ML control logic circuit 462 generates a WAIT signal in response to a RB (Ready/Busy) signal from the NAND flash memory 314 to provide the WAIT signal to the host 300. The ML control logic circuit 462 generates a loading signal LD to control the first address register 413 and the flash address register 463. The ML control logic circuit 462 generates row and column address signals BRA and BCA to provide the signals BRA and BCA to the buffer memory core 430.

An operation mode signal STA is transferred between the SDRAM control logic circuit 461 and the ML control logic circuit 462. The flash address register 463 stores address of the flash memory 314 supplied from the host 300 via the first data input and output unit 440 and provides the stored address data to the NAND flash memory 314 via the second data input and output unit 450 upon the control of the LD signal.

Operations of the data processing apparatus according to some embodiments of the invention as illustrated by FIG. 5 are described below. In SDRAM operation mode of operation, in some embodiments according to the invention, the first and second selectors 416 and 417 of the address generating circuit 410 select the first and second latches 411 and 412, respectively. Therefore, the row and column addresses provided from the host 300 are provided to the main memory core 420 to select a particular cell. During a read operation, data read from the main memory core 420 via the first data input and output unit 440 are outputted to the host 300. During a write operation, data provided from the host 300 are stored in the main memory core 420.

In a memory link mode of operation, in some embodiments according to the invention, the ML-SDRAM 312 acts as a buffer to allow data and command, etc., to be transferred between the host 300 and the NAND flash memory 314. In a Page read mode (PRM) of operation, in some embodiments according to the invention, when signals CKE, DCS, RAS, FCS and WE provided from the host 300 are activated, the RA and CA control signals are activated by the SDRAM control logic circuit 461 so that the first and second selectors 416 and 417 select the first address register 413. A row address signal is stored in the first address register 413. During a read operation, the address stored in the first address register 413 is designated as a destination address.

In addition, the ML control logic circuit 462 generates the WAIT signal in response to an active state of the FCS signal and outputs the WAIT signal to the host 300. Therefore, the host 300 may recognize that an operation of the ML-SDRAM 312 is being performed, by means of detecting the active state of the WAIT signal.

When the CAS signal is activated, a column address signal is stored in the first address register 413. During a read operation, the row and column addresses stored in the first address register 413 are provided to the main memory core 420 as a start address designating a destination location of the main memory core 420 in which the data read from the NAND flash memory 314 are stored.

Flash address data (i.e. the address of the flash memory 300) are applied to the first data input and output unit 440 via the data line 304. The applied flash address data is stored in the flash address register 463. The flash address data stored in the flash address register 463 are provided as a start address designating a source location from which the data of the flash memory 314 are to be read out.

After the address is loaded from the host, the ML control logic circuit 462 activates the signals CLE, CE and RE to provide a read command to the flash memory 314. Next, the ALE signal is activated instead of the CLE signal and the flash address data stored in the flash address register 463 are provided to the flash memory 314 via the second data input and output unit 450.

The flash memory 314 receives the flash address data as a start address representing the source location. Based on the received flash address data, the flash memory 314 accesses one 'page' of data and outputs one page of data. Data read from the flash memory 314 is stored in the buffer memory core 430 via the second data input and output unit 450. The buffer memory core 430 is accessed by the BRA and BCA signals of the ML control logic circuit 462 to store one 'page' of data.

After the data read from the flash memory 314 is stored in the buffer memory core 430, the ML control logic circuit 462 generates the BRA and BCA address signals to access the data stored in the buffer memory core 430. Additionally, the ML control logic circuit 462 generates a copy write control signal CW to control the switch 464 so that the data in the buffer memory core 430 is applied to the main memory core 420.

Additionally, the ML control logic circuit 462 applies the LD signal to the first address register 413 so that the destination address signal stored in the first address register 413 may be applied to the main memory core 420. The row and column addresses stored in the first address register 413 are provided to the main memory core 420. The destination row address stored in the first address register 413 is loaded to the row counter 414 as an initial value. The row counter 414 starts to count from the initial value. Additionally, the destination column address stored in the first address register 413 is loaded to the column counter 424 as an initial value. The column counter 424 starts to count from the initial value. The row counter 414 and the column counter 424 continue to count until a 'page' of data is written into the main memory core 420. Thus, the main memory core 420 performs a write operation.

A signal INT maintains an active state while the buffer memory core 430 performs the copy operation, which enables the data stored in the buffer memory core 430 to be copied to the main memory core 420. Therefore, the host 300 may recognize that the operation of the main memory core 420 is being performed. During above copy operation, the host 300 maintains an interrupt state of the SDRAM.

The PRM (Page Read Mode) operation is terminated when the data are completely copied to the main memory core 420 from the buffer memory core 430. Then, the WAIT signal is changed to a non-active state, and consequently the host 300 may recognize that the PRM operation is complete.

The host 300 checks the state of the WAIT signal and the INT signal, and when the WAIT signal has an active state, the host 300 does not generate a new command associated with the flash memory, and when the INT signal has an active state, the host 300 does not generate a new command associated with the SDRAM. However, when the WAIT signal has an active state and the INT signal has a non-active state, the host 300 may generate a new SDRAM command to perform another operation independently of the operation of the flash memory 314.

When both the WAIT signal and INT signal have non-active states, the data stored in the destination location addressed by the destination address are accessed by a general read operation of the SDRAM, thereby completing the read operation of the flash memory 314.

In a Page Write mode (PWM) of operation, in some embodiments according to the invention, when the signals CKE, DCS, RAS, FCS and RE provided from the host 300 are activated, the RA and CA control signals are activated by the SDRAM control logic circuit 461 so that the first and second selectors 416 and 417 select the first address register 413. At the same time, a row address signal is stored in the first address register 413. During a write operation, the address stored in the first address register 413 is designated as a source address.

In addition, the ML control logic circuit 462 generates the WAIT signal in response to an active state of the FCS signal and outputs the WAIT signal to the host 300. Therefore, the host 300 may recognize that the operation of the ML-SDRAM 312 is being performed, by means of detecting the active state of the WAIT signal.

After the address is loaded from the host 300 into the first address register 413, the row and column addresses stored in the first address register 413 are provided to the main memory core 420. The row address stored in the first address register 413 is loaded into the row counter 414 as an initial value and the column address stored in the first address register 413 is loaded to the column counter 424 as an initial value.

The flash address data are applied to the first data input and output unit 440 via the data line 304. The applied flash address data are stored in the flash address register 463. The flash address data stored in the flash address register 463 are provided as a start address representing the destination location in which data are written to the flash memory 314.

The row counter 414 starts to count from it's the initial value (i.e., the row address stored in the first address register 413). Additionally, the column counter 424 starts to count from the initial value (i.e., the column address stored in the first address register 413). The row counter 414 and the column counter 424 continue to count until one 'page' of data is read out from the main memory core 420. Thus, one 'page' of data is accessed from the main memory core 420.

The ML control logic circuit 462 generates a copy read control signal CR and controls the switch 464 so that the data read from the main memory core 420 are applied to the buffer memory core 430. In addition, based on the BRA and BCA signals, the data are copied from the main memory core 420 to the buffer memory core 430. The ML control logic circuit 462 maintains the INT signal at an active state while data are copied from the main memory core, thereby notifying the host 300 that the main memory core 420 is in operation. When the copy operation is complete, the INT signal is changed to a non-active state, and the switch 464 is cut off.

After the address is loaded from the host 300 into the flash address register 463, the ML control logic circuit 462 generates the signals CLE, CE and WE having active states to provide the flash memory 314 with a write command. Next, the ALE signal is activated instead of the CLE signal and the address data stored in the flash address register 463 are provided to the flash memory 314 via the second data input and output unit 450.

The flash memory 314 receives the address data and prepares to write a "page" of data into a destination location based on the input address data as a start address representing the destination location. Data read from the buffer memory core 430 is provided to the flash memory 314 via the second data input and output buffer 450. The flash memory 314 stores the read data in the designated destination location. During a write operation, the flash memory 314 maintains the RB signal at an active state to notify the ML control logic circuit 462 that the write operation is being performed. When the write operation is complete, the RB signal is changed to a non-active state and, in response to a change in the RB signal, the WAIT signal is changed to a non-active state upon the control of the ML control logic circuit 462. Thus, the host 300 recognizes that the PWM operation is complete.

Therefore, according to the present invention, data may be transferred between the host 300 and the main memory core 240 irrespective to the operation of the flash memory 314 when the INT signal is in an inactive state. In a Block Read Mode (BRM) of operation, in some embodiments according to the invention, one "block" of flash memory corresponds to tens of pages, for example, 32 pages of the flash memory. Therefore, when a buffer memory core 430 has a size corresponding to one "page", one "block" is read from the flash memory 314 by repeating the above PRM operation 32 times. When the buffer memory core 430 has a size corresponding to one "block", the size of one page may be changed to have a size corresponding to one "block" so as to perform the PRM operation. In a Block Write mode (BWM) of operation, in some embodiments according to the invention, in a flash memory, one block includes tens of pages, for example, 32 pages. Therefore, when the buffer memory has a size corresponding to one "page", a "block" of data is written to the flash memory by repeating the above PWM operation 32 times. When the buffer memory has a size corresponding to one "block", the size of one page may be changed to have a size corresponding to one "block" so as to perform the PWM (Page Write Mode) operation.

Thus, a memory controller in a system board may have only a DRAM interface so that the size of the system board may be reduced. Accordingly, it may be possible to provide products, such as a mobile phone, having reduced thickness, weight, and size due to the reduced size of a system board including the smaller memory controller.

According to some embodiments of the present invention, a low speed non-volatile memory such as a NAND flash memory may be accessed using a control circuit that is implemented in a high-speed volatile memory such as a DRAM. The control circuit may allow the DRAM to interface with the low speed nonvolatile memory where the high-speed volatile memory acts as a master to the low speed nonvolatile memory (slave). A system may access the low speed nonvolatile memory by using a high speed DRAM interface. The system may therefore include only a DRAM interface, which may reduce the size of the design are simplify the system architecture (by, for example, simplifying the memory control circuit).

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed:

1. A multi-port volatile memory device, comprising:
   a first port configured for data transfer to/from an external host system and the device;
   a volatile main memory core configured to store data received thereat and read requested stored data thereform;
   a volatile sub memory core configured to store data received thereat and read requested stored data therefrom;
   a main interface circuit coupled to the first port and configured to provide data to/from the volatile main memory core and the first port in a master mode and configured to provide data to/from the volatile sub memory core and the first port in a slave mode;
   a second port configured for data transfer to/from an external non-volatile memory device and the device; and
   a sub interface circuit coupled to the second port and configured to provide data to/from the volatile sub memory core and the second port in the slave mode.

2. A multi-port volatile memory device according to claim 1 wherein the main interface circuit comprises:
   a command decoder configured to decode a command provided from the external host system to generate at least one internal command control signal;
   an address buffer configured to generate at least one internal address control signal based on an address signal provided from the external system;
   a data input/output buffer configured to transfer data between the external host system and the volatile main memory core in the master mode and configured to transfer data to/from the external host system and the volatile sub memory core in the slave mode; and
   a controller configured to control the volatile main memory core and the volatile sub memory based on first control data provided through the address buffer and the data input/output buffer in response to a master/slave mode select signal provided from the external host system.

3. A multi-port volatile memory device according to claim 1 wherein the main interface circuit further comprises:
   a power management circuit configured to enable/disable a power supply voltage to the volatile sub memory core and the sub interface circuit in response to the at least one internal command control signal provided from the command decoder.

4. A multi-port volatile memory device according to claim 2 wherein a capacity of the volatile sub memory core corresponds comprises at least one page of memory or one block of memory, the flash memory being accessed in a unit of one page of memory or one block of memory.

5. A multi-port volatile memory device according to claim 1 wherein the sub interface circuit includes a NAND type flash controller configured to control data transfer between the sub memory core and the flash memory coupled to the second port in response to second control data provided from the controller.

6. A multi-port volatile memory device according to claim 1 wherein the non-volatile memory, the volatile main memory core, and the volatile sub memory core are included in a single package.

7. A multi-port volatile memory device according to claim 1 wherein the second port is configured to couple to a NAND type flash memory and the device comprises a synchronous DRAM.

* * * * *